(12) United States Patent
Takai et al.

(10) Patent No.: US 11,251,796 B2
(45) Date of Patent: Feb. 15, 2022

(54) PHASE LOCK CIRCUITRY USING FREQUENCY DETECTION

(71) Applicant: MICRON TECHNOLOGY, INC., Boise, ID (US)

(72) Inventors: Yasuhiro Takai, Sagamihara (JP); Maksim Kuzmenka, Munich (DE); Mani Balakrishnan, Munich (DE); Martin Brox, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/099,114

(22) Filed: Nov. 16, 2020

(65) Prior Publication Data

US 2021/0075428 A1 Mar. 11, 2021

Related U.S. Application Data

(62) Division of application No. 16/368,706, filed on Mar. 28, 2019, now Pat. No. 10,840,918.

(51) Int. Cl.
*H03L 7/087* (2006.01)
*H03K 5/135* (2006.01)
*H03L 7/099* (2006.01)
*H03K 5/14* (2014.01)
*G11C 7/22* (2006.01)

(52) U.S. Cl.
CPC .............. *H03L 7/087* (2013.01); *G11C 7/222* (2013.01); *H03K 5/135* (2013.01); *H03K 5/14* (2013.01); *H03L 7/0992* (2013.01)

(58) Field of Classification Search
CPC ..... H03L 7/00; H03L 7/06; H03L 7/08; H03L 7/085; H03L 7/087; H03L 7/099; H03L 7/0992; H03K 5/13; H03K 5/14
See application file for complete search history.

(56) References Cited

U.S. PATENT DOCUMENTS

| | | |
|---|---|---|
| 2005/0111607 A1 | 5/2005 | Loke et al. |
| 2011/0291703 A1 | 12/2011 | Lee et al. |
| 2013/0135015 A1 | 5/2013 | Hossain et al. |
| 2020/0313678 A1 | 10/2020 | Takai et al. |

*Primary Examiner* — Diana J. Cheng
(74) *Attorney, Agent, or Firm* — Dorsey & Whitney LLP

(57) ABSTRACT

A phase-locked loop (PLL) circuit is configured to adjust a value of a bias voltage based on a comparison between a reference clock signal and a feedback clock signal, and an oscillator circuit is configured to provide the feedback clock signal and phase-shifted clock signals based on a value of the bias voltage. A frequency detector of the frequency detector is configured to cause an adjustment to the value of the bias voltage in response to detection of a frequency deviation between the reference clock signal and the feedback clock signal. To avoid a metastable state, the frequency detector is configured to apply an asynchronous delay to one of the reference clock signal or the feedback clock signal prior to detection of the frequency deviation.

18 Claims, 6 Drawing Sheets

PHASE LOCK CIRCUITRY USING FREQUENCY DETECTION

CROSS REFERENCE TO RELATED APPLICATION(S)

This application is a divisional of U.S. application Ser. No. 16/368,706 filed Mar. 28, 2019, which application is incorporated herein by reference, in its entirety, for any purpose.

BACKGROUND OF THE INVENTION

High data reliability, high speed of memory access, low power, and reduced chip size are features that are demanded from semiconductor memory. Within a memory, relative clock timing may be important to ensure data is reliably transmitted and received. In some examples, clock signal adjustment circuitry may encounter situations where relative timing of respective transitions of control and clock signals may cause metastability in a clock signal. As an example, a metastability may include erroneous detection of a frequency or phase deviation in the clock signal when little or no phase or frequency deviation exists. When this happens, the clock signal adjustment circuitry may adjust characteristics of the clock signal in an attempt to correct the erroneously-detected phase or frequency deviation, which may cause an actual frequency or phase deviation in the clock signal. Introduction of an actual frequency or phase deviation in the clock signal may affect reliability of a device in its ability to perform operations that are based on the clock signal.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes devices and techniques for resetting clock input circuits and divider circuits prior to beginning write operations in a memory device. For example, many memory devices, such as double data rate (DDR) DRAM devices, including DDR4, DDR5, low power DDR5 (LPDDR5), graphics DDR (GDDR) DRAM (e.g., GDDR5) devices, include circuitry to perform read and write operations. Many different clock signals can be employed to allow the memory device to provide high performance reading and writing from and into the memory. The devices may include clock input and clock generation circuitry that is configured to adjust relative timing characteristics of at least some internally-generated clock signals based on an operation to be performed to facilitate performance of the operation (e.g., receipt of write data at a data terminal DQ or transmission of read data to the data terminal DQ) at an expected time. The circuitry may include clock dividers, phase-lock loops (PLLs), voltage-controlled oscillators (VCOs), etc., that are all configured to adjust relative timing and frequency of at least some of the internally-generated clock signals according to timing of externally-received clock signals, such as an external data clock signal WCK. In some examples, PLL circuitry may include a frequency detector that includes input delay circuitry that is configured to offset relative timing of a reference clock and a feedback clock signal to reduce a likelihood of encountering a metastable condition. A metastable condition may occur when signal transition timing is such that the frequency detector could erroneously detect a frequency deviation between signals when little or no actual deviation is present. Inclusion of the input delay circuitry to reduce a likelihood of encountering the metastable condition may improve reliability of the clock input and generation circuitry.

Figure 1:
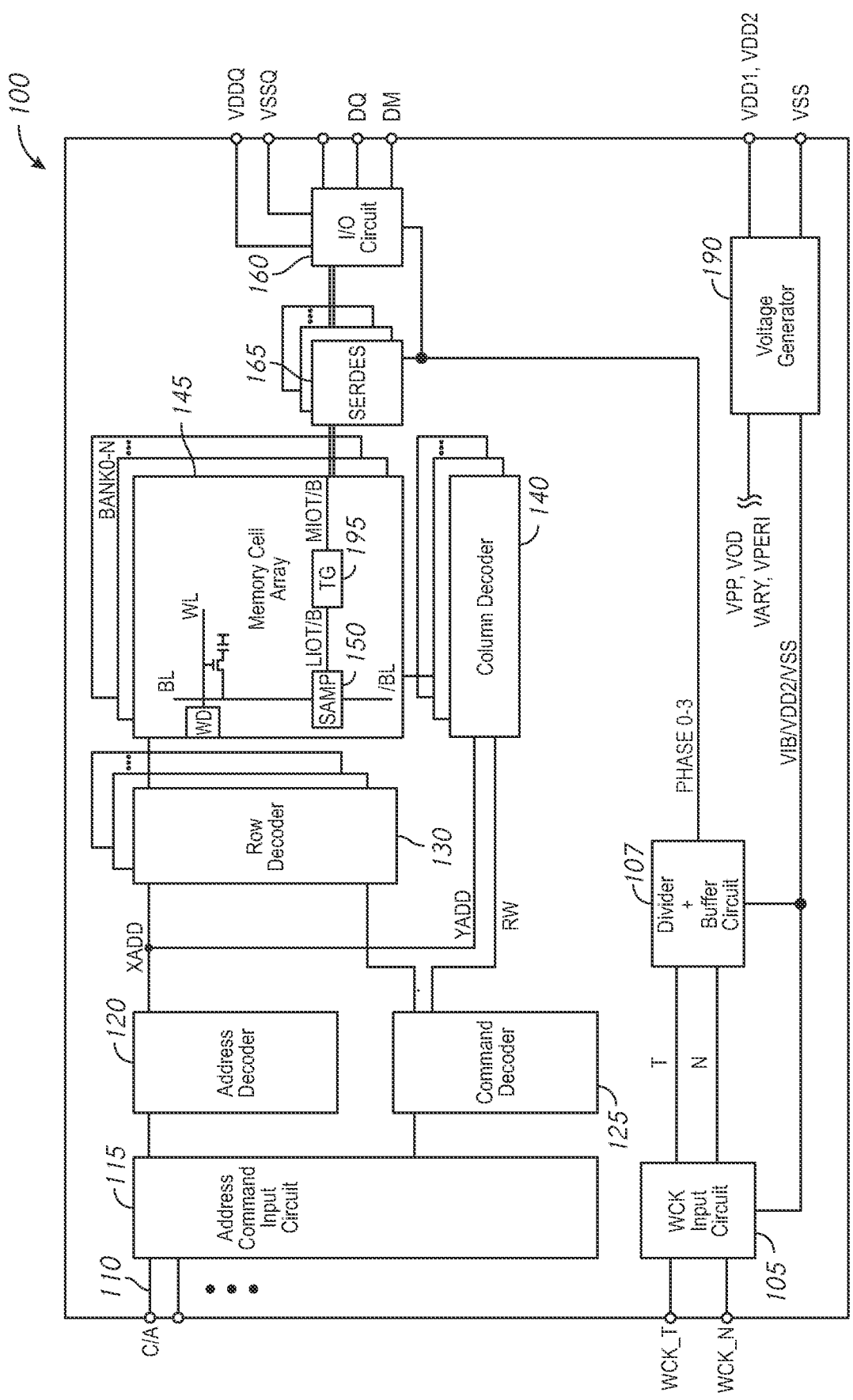
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a WCK input circuit 105, a divider and buffer circuit 107, an address/command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a serializer/deserializer (SERDES) circuitry 165, an input/output (I/O) circuit 160, and a voltage generator circuit 190. The semiconductor device 100 may include a plurality of external terminals including address and command terminals coupled to command/address bus 110, clock terminals CK and /CK, data terminals DQ, and DM, and power supply terminals VDD1, VDD2, VSS, VDDQ, and VSSQ. The semiconductor device may be mounted on a substrate, for example, a memory module substrate, a mother board or the like.

The memory cell array 145 includes a plurality of banks 0-N, with each bank 0-N including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 152 are provided for their corresponding bit lines BL and coupled to at least one respective local I/O line further coupled to a respective one of at least two main I/O line pairs, via transfer gates TG 195, which function as switches. In some examples, the sense amplifiers 150 may include threshold voltage compensation circuitry configured to compensate for threshold voltage differences between components of the sense amplifier.

Threshold voltage differences may exist due to process, voltage, and temperature (PVT) variance among various components.

The address/command input circuit 115 may receive an address signal and a bank address signal from outside (e.g., via a memory controller) at the command/address terminals via the command/address bus 110 and may transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may also receive command signals and chip select signals from outside (e.g., from the memory controller) at the command/address terminals via the command/address bus 110 and may provide the command signals and the chip select signals to the command decoder 125. The command signals may include various memory commands, such as access (e.g., read/write) commands. The chip select signals select the semiconductor device 100 to respond to commands and addresses provided to the command and address terminals. That is, in response to receipt of an active chip select signal at the semiconductor device 100, commands and addresses at the command/address terminals via the command/address bus 110 may be decoded to perform memory operations. The command decoder 125 may decode the command signals to generate various internal command signals. For example, the internal command signals may include a row command signal to select a word line, a column command signal, such as a read command or a write command, to select a bit line. The internal command signals can also include output and input activation commands, such as clocked command.

Accordingly, when a read command is issued and a row address and a column address are timely supplied with the read command, read data is read from a memory cell in the memory cell array 145 designated by the row address and the column address. The read command may be received by the command decoder 125. Read/write amplifiers of the SERDES circuitry 165 may receive the read data DQ and provide the read data DQ to the I/O circuit 160, The I/O circuit 160 may provide the read data DQ to outside via the data terminals DQ, together with a data mask signal at the data mask terminal DM. The read data may be provided at a time defined by read latency RL information that can be programmed in the semiconductor device 100, for example, in a mode register (not shown in FIG. 1). The read latency RL information RL may be defined in terms of clock cycles of the CK clock signal. For example, the read latency RL information may be defined as a number of clock cycles of the CK signal after the read command is received at the semiconductor device 100 when the associated read data is provided at an output via the data terminals DQ and DM.

Similarly, when the write command is issued and a row address and a column address are timely supplied with the write command, and then the I/O circuit 160 may receive write data at the data terminals DQ, together with a data mask DM signal and provide the write data via the read/write amplifiers of the SERDES circuitry 165. The SERDES circuitry 165 may provide the write data to the memory cell array 145. The write command may be received by the command decoder 125. Thus, the write data may be written in the memory cell designated by the row address and the column address. The write data and the data mask signal may be provided to the data terminals DQ and DM, respectively, at a time that is defined by write latency WL information. The write latency WL information may be programmed in the semiconductor device 100, for example, in the mode register (not shown in FIG. 1). The write latency WL information may be defined in terms of clock cycles of a clock signal CK. For example, the write latency WL information may be a number of clock cycles of the CK signal after receipt of the write command at the semiconductor device 100 when the associated write data and data mask signal are received at the data terminals DQ and DM.

Turning to the explanation of the external terminals included in the semiconductor device 100, the power supply terminals may receive power supply voltages VDD1, VDD2, and VSS. These power supply voltages VDD1, VDD2, and VSS may be supplied to a voltage generator circuit 190. The voltage generator circuit 190 may generate various internal voltages, VPP, VOD, VARY, VPERI, VIB, and the like based on the power supply voltages VDD1, VDD2, and VSS. Specifically, the internal voltage VIB may be generated using the VDD1 voltage. The internal voltage VIB may have a greater magnitude than the supply voltage VDD2. The internal voltage VPP is mainly used in the row decoder 130 and column decoder 140, the internal voltages VOD and VARY are mainly used in the sense amplifiers 150 included in the memory cell array 145, the internal voltage VIB (along with the power supply voltages VDD2 and VSS) is used in the WCK input circuit 105 and the divider and buffer circuit 107, and the internal voltage VPERI is used in many other circuit blocks. The I/O circuit 160 may receive the power supply voltages VDDQ and VSSQ. For example, the power supply voltages VDDQ and VSSQ may be the same voltages as the power supply voltages VDD1 and VSS, respectively. However, the dedicated power supply voltages VDDQ and VSSQ may be used for the I/O circuit 160.

The clock terminals WCK_T and WCK_N may receive an external clock signal WCK_T and a complementary external clock signal WCK_N, respectively. The WCK_T and WCK_N clock signals may be write clock signals, in some examples. The WCK_T and WCK_N clock signals may be supplied to a WCK input circuit 105. The WCK input circuit 105 may generate complementary internal clock signals T and N based on the WCK_T and WCK_N clock signals and a column access strobe (CAS) synchronization SYNC command. The WCK input circuit 105 may provide the T and N clock signals to the divider and buffer circuit 107. The divider and buffer circuit 107 may generate phase and frequency controlled internal clock signals PHASE0-3 based on the T and N clock signals T and N, the CAS SYNC command. The PHASE 0-3 clock signals may be phase shifted relative to one another by 90 degrees. For example, the PHASE 0 clock signal is phased-shifted 0 degrees relative to the internal clock signal T, the PHASE 1 clock signal is phased-shifted 90 degrees relative to the internal clock signal T, the PHASE 2 clock signal is phased-shifted 180 degrees relative to the internal clock signal T, and the PHASE 3 clock signal is phased-shifted 270 degrees relative to the internal clock signal T.

In some examples, the divider and buffer circuit 107 may include a phase-locked loop (PLL) circuit coupled to a voltage controlled oscillator (VCO) circuit configured to provide the PHASE 0-3 clock signals. The PLL circuit may be configured to control the bias voltage provided to the VCO circuit, which may be used by the VCO to control a phase a frequency of the PHASE 0-3 clock signals. The PLL circuit may cause the bias voltage to be adjusted based on detection of phase and/or frequency differences between a reference clock signal (e.g., generated from the T and N clock signals) and a feedback clock signal from the VCO. In some cases, because the PLL attempts to adjust the timing and the frequency of the feedback clock signal to match the same of the reference clock signal, frequency detection circuitry of the PLL circuit may encounter scenarios that result in metastable states (e.g., or metastable conditions). A metastable condition may occur when relative timing of transitions of the reference clock signal and the feedback clock signal results in conditions where logic circuitry of the PLL circuitry erroneously detects a frequency deviation between the reference clock signal and the feedback clock signal. As a result of the erroneous detection of the frequency deviation, the PLL circuit may cause the bias voltage to be adjusted such that the frequency and timing of the PHASE 0-3 clock signals are changed. The change to the PHASE 0-3 clock signals based on the erroneous frequency deviation detection may affect operation of circuitry that uses the PHASE 0-3 clock signals (e.g., the I/O circuit 160). To reduce a likelihood that the PLL circuit encounters a metastable state, a frequency detector of the PLL circuit may include an input delay circuit that is configured to introduce an asynchronous timing delay to one of the reference clock signal or the feedback clock signal such that signal transitions are offset from one another. As the frequency detector may be configured to detect frequency differences, timing or phase differences caused by the asynchronous timing delay may not affect operation of the frequency detector. Applying the asynchronous timing delay to one of the reference or feedback clock signals may reduce likelihood of encountering conditions for a metastable state, which may improve reliability of the PHASE 0-3 clock signals provided by the PLL and VCO circuits of the divider and buffer circuit 107.

The divider and buffer circuit 107 may provide the PHASE 0-3 clock signals to the SERDES circuitry 165 and to the I/O circuit 160. The SERDES circuitry 165 may support high speed read and write operations by deserializing high speed write data and serializing high speed read data. For example, during a high speed write operation, the I/O circuit 160 may receive and buffer (e.g., via input buffers) serialized write data in response to the PHASE 0-3 clock signals. The SERDES circuitry 165 may be configured to retrieve the serialized write data from the input buffers of the I/O circuit 160 responsive to the PHASE 0-3 clock signals, and deserialize the serialized write data (e.g., make it parallel) to provide deserialized write data. The SERDES circuitry 165 may provide the deserialized write data to memory cell array 145. Thus, during a high speed write operation, data is received at I/O circuit 160 via the data terminals DQ and is deserialized using the SERDES circuitry 165 using the PHASE 0-3 clock signals.

Additionally, during a high speed read operation, deserialized read data may be received from the memory cell array 145, and the SERDES circuitry 165 may be configured to serialize the deserialized read data responsive to a read clock signal (not shown) to provide serialized read data. The SERDES circuitry 165 may provide the serialized read data to the I/O circuit 160 responsive to the read clock signal. The read clock signals may be used by transceivers of the SERDES circuitry 165 to support the high speed read operations to serialize the deserialized read data received from the memory cell array 145. That is, the SERDES circuitry 165 may serialize the deserialized read data based on timing of the read clock signals provide the serialized read data.

Figure 2:
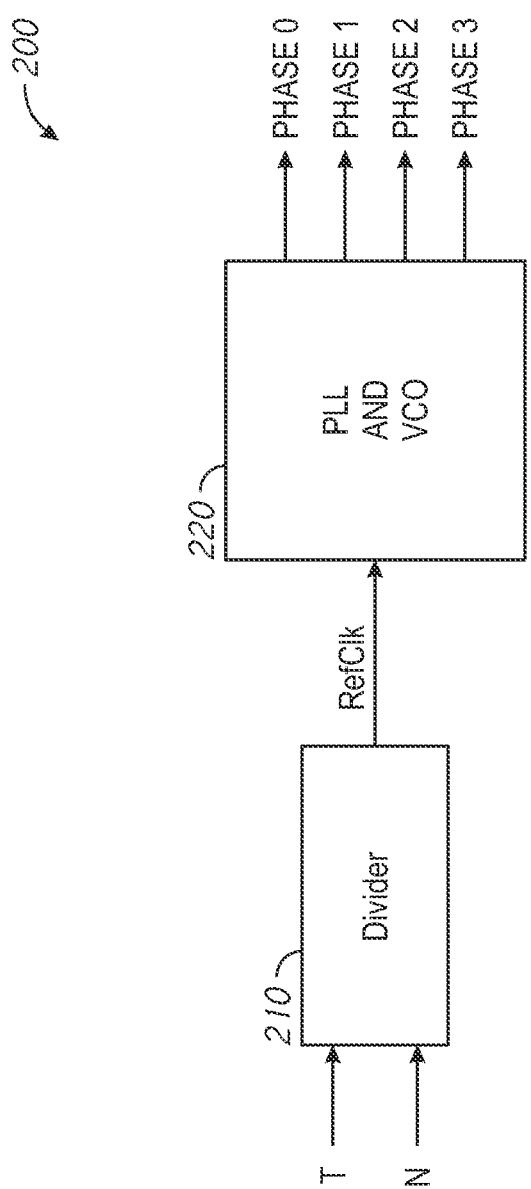
FIG. 2 is a block diagram of part of a PLL and buffer circuit in accordance with an embodiment of the disclosure.

FIG. 2 is a block diagram of a PLL and buffer circuit 200 in accordance with an embodiment of the disclosure. The PLL and buffer circuit 200 may include a divider circuit 210 and a PLL and VCO circuit 220. The divider and buffer circuit 107 of FIG. 1 may implement the PLL and buffer circuit 200, in some examples. The divider circuit 210 may be configured to divide the T and N clock signals to provide a reference clock signal RefClk and the PLL and VCO circuit 220 may be configured to generate frequency and phase shifted clock signals PHASE 0-3 based on the RefClk signal.

The divider circuit 210 may include a frequency divider circuit that is configured to provide the RefClk signal based on the complementary T and N clock signals. The RefClk signal may have a frequency that is less than a frequency of the T and N clock signals. In some examples, the frequency of the RefClk signal (e.g., first or second signal) is one-half of the frequency of the T and N clock signals.

The PLL and VCO circuit 220 may include a PLL circuit coupled to a multi-stage VCO circuit. The multi-stage VCO circuit may be configured to provide the PHASE0-3 clock signals having relative phases and frequencies based on a bias voltage provided from the PLL circuit. The PLL circuit may control the bias voltage based on relative timing and frequencies of the RefClk signal and a feedback clock signal (e.g., second or first signal) provided from the multi-stage VCO circuit. The PLL may include a phase detector circuit and a frequency detector. The phase detector circuit may detect a phase difference between the RefClk signal and the feedback clock signal from the multistage VCO circuit, and in response to detection of a deviation in the relative phases, may cause the bias voltage to be adjusted to change the frequency and phase of the PHASE0-3 clock signals and the feedback clock signal. The frequency detector may detect a frequency difference between the RefClk signal and the feedback clock signal from the multistage VCO circuit, and in response to detection of a deviation in the relative frequencies, may cause the bias voltage to be adjusted to change the frequency and phase of the PHASE0-3 clock signals and the feedback clock signal. The frequency detector may include an input delay circuit that is configured to delay timing of the RefClk signal and/or the feedback clock signal to avoid a metastable condition or state. The PHASE 0-3 clock signals may have a frequency that is equal to a frequency of the RefClk signal, and may be phase shifted relative to one another by 90 degrees. For example, the PHASE 0 clock signal may be phased-shifted 0 degrees relative to the RefClk signal, the PHASE 1 clock signal may be phased-shifted 90 degrees relative to the RefClk signal, the PHASE 2 clock signal may be phased-shifted 180 degrees relative to the RefClk signal, and the PHASE 3 clock signal may be phased-shifted 270 degrees relative to the RefClk signal. The PHASE 0-3 clock signals may be provided to I/O circuitry to receive and buffer write data received via data terminals in input buffers, and/or to deserialize received write data for storing in a memory cell array.

In operation, the PLL and buffer circuit 200 may be configured to generate frequency and phase shifted clock signals PHASE 0-3 based on received complementary (e.g., phase-shifted 180 relative to one another) clock signals T and N. The divider circuit 210 may divide a frequency of the T and N clock signals to provide the RefClk signal having a frequency that is less than the frequency of the T and N clock signals. In some examples, the frequency of the RefClk signal is one-half of the frequency of the T and N clock signals. However, other relative frequency differences between the RefClk signal and the T and N clock signals may be implemented without departing from the scope of the disclosure.

The PLL circuit of the PLL and VCO circuit 220 may control the bias voltage provided to the multistage VCO circuit based on relative timing and frequencies of the RefClk signal and a feedback clock signal provided from the multi-stage VCO circuit. The bias voltage may control the timing and frequency of the PHASE 0-3 clock signals provided by the multi-stage VCO circuit. Specifically, the phase detector circuit of the PLL may detect a phase difference between the RefClk signal and the feedback clock signal from the multistage VCO circuit, and in response to detection of a deviation in the relative phases, may cause the bias voltage to be adjusted to change the frequency and phase of the PHASE0-3 dock signals and the feedback clock signal. In addition, the frequency detector of the PLL may detect a frequency difference between the RefClk signal and the feedback clock signal from the multistage VCO circuit, and in response to detection of a deviation in the relative frequencies, may cause the bias voltage to be adjusted to change the frequency and phase of the PHASE0-3 clock signals and the feedback clock signal. However, because the PLL attempts to adjust the timing and the frequency of the feedback clock signal to match the same of the RefClk signal, the logic circuity of the frequency detector may encounter scenarios that result in metastable states (e.g., or metastable conditions). A metastable condition may occur when relative timing of transitions of the RefClk and feedback clock signals results in conditions where logic circuitry of the frequency detector erroneously detects a frequency deviation between the RefClk signal and the feedback clock signal. As a result of the erroneous detection of the frequency deviation, the frequency detector may cause the bias voltage to be adjusted such that the frequency and timing of the PHASE 0-3 clock signals are changed. The change to the PHASE 0-3 clock signals based on the erroneous frequency deviation detection may affect operation of circuitry that uses the PHASE 0-3 clock signals, To reduce a likelihood that the frequency detector encounters a metastable state, the frequency detector may include an input delay circuit that is configured to introduce an asynchronous timing delay to one of the RefClk signal or the feedback clock signal such that signal transitions are offset. As the frequency detector is configured to detect frequency differences, timing or phase differences caused by the asynchronous timing delay may not affect an ability of the frequency detector to detect frequency differences between the RefClk and feedback clock signals.

The mufti-stage VCO circuit may be configured to provide the PHASE0-3 clock signals having relative phases and frequencies based on the bias voltage provided from the PLL circuit. The PHASE 0-3 clock signals may have a frequency that is equal to a frequency of the RefClk signal, and may be phase shifted relative to one another by 90 degrees. For example, the PHASE 0 clock signal may be phased-shifted 0 degrees relative to the RefClk signal, the PHASE 1 clock signal may be phased-shifted 90 degrees relative to the RefClk signal, the PHASE 2 clock signal may be phased-shifted 180 degrees relative to the RefClk signal, and the PHASE 3 clock signal may be phased-shifted 270 degrees relative to the RefClk signal. The PHASE 0-3 clock signals may be provided to I/O circuitry to receive and buffer write data received via data terminals in input buffers, and/or to deserialize received write data for storing in a memory cell array.

Applying the asynchronous timing delay to one of the RefClk or feedback clock signals may reduce likelihood of encountering conditions for a metastable state, which may improve reliability of the PHASE 0-3 clock signals provided by the PLL and VCO circuit 220.

Figure 3:
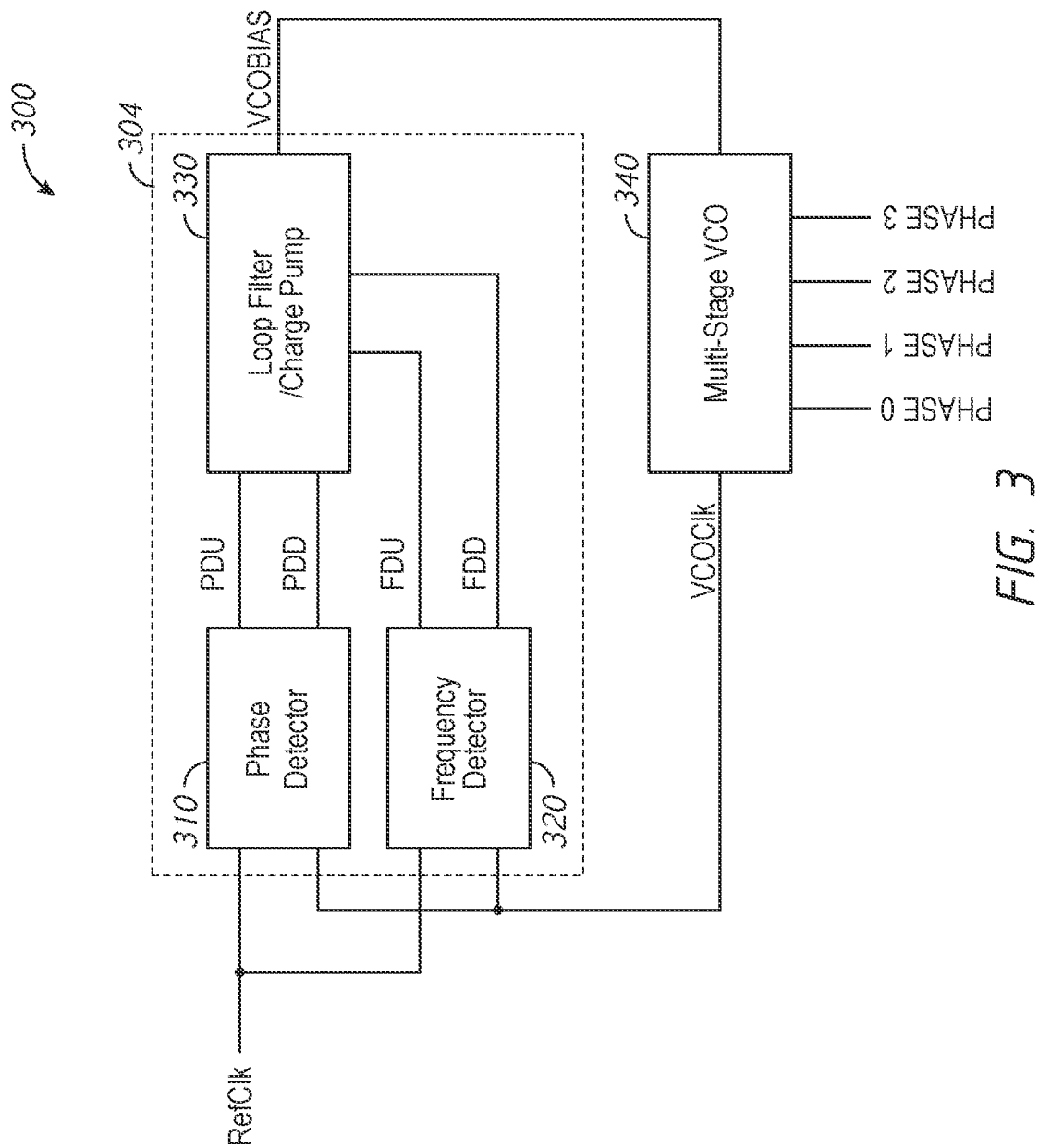
FIG. 3 is a block diagram of part of a PLL circuit in accordance with an embodiment of the disclosure.

FIG. 3 is a block diagram of part of a PLL and VCO circuit 300 in accordance with an embodiment of the disclosure. The PLL and VCO circuit 300 may include a 304 and a multi-stage VCO. The 304 may adjust a bias voltage VCOBIAS provided to the multi-stage VCO based on comparison of the RefClk signals and the feedback clock signal VCOClk. The multi-stage VCO may provide the PHASE 0-3 clock signals and the VCOClk signal based on a voltage of the VCOBIAS voltage. The divider and buffer circuit 107 of FIG. 1 and/or the PLL and VCO circuit 220 of FIG. 2 may implement the PLL and VCO circuit 300, in some examples.

The 304 may include the phase detector 310, the frequency detector 320, and the loop filter/charge pump 330. The phase detector 310 may detect a phase difference between the RefClk signal and the VCOClk signal from the multi-stage VCO, and in response to detection of a deviation in the relative phases, may provide a pulse on one of a phase-deviation up signal PDU or phase-deviation down signal PDD selected based on a direction of the phase deviation. For example, in response to a determination that the phase of the VCOClk signal is delayed relative to the phase of the RefClk signal, the phase detector 310 may set the signal. Conversely, in response to a determination that the phase of the RefClk signal is delayed relative to the phase of the VCOClk signal, the phase detector 310 may set the PDD signal. In response to one of the PDU or the PDD signals being set, the loop filter/charge pump 330 may adjust a voltage of the VCOBIAS voltage accordingly.

The frequency detector 320 may detect a frequency difference between the RefClk signal and the VCOClk signal, and in response to detection of a deviation in the relative frequencies, may provide a pulse on one of the frequency-deviation up signal FDU or the frequency-deviation down signal FDD. For example, in response to a determination that the frequency of the VCOClk signal is less than a frequency of the phase of the RefClk signal, the frequency detector 320 may set the FDU signal. Conversely, in response to a determination that in response to a determination that the frequency of the VCOClk signal is greater than the frequency of the phase of the RefClk signal, the phase detector 310 may set the FDD signal. In response to one of the FDU or the FDD signals being set, the loop filter/charge pump 330 may adjust a voltage of the VCOBIAS voltage accordingly. The frequency detector may include an input delay circuit that is configured to an asynchronous delay to timing of one of the RefClk signal or the VCOClk signal to avoid a metastable state.

The loop filter/charge pump 330 may include circuitry configured to provide the VCOBIAS voltage. The loop filter/charge pump 330 may adjust the VCOBIAS voltage in response to pulses on the PDD and PDU signals from the phase detector 310 and in response to pulses on the FDD and FDU signals from the frequency detector 320. That is, the loop filter/charge pump 330 includes circuitry that is configured to adjust the VCOBIAS voltage higher in response to a pulse on one of the PDU or FDU signals, and further includes circuitry that is configured to adjust the VCOBIAS voltage lower in response to a pulse on one of the PDD or FDD signals. The loop filter/charge pump 330 may be configured to hold the VCOBIAS voltage when none of the PDU, FDU, PDD, and FDD signals are set.

The multi-stage VCO may be configured to provide the PHASE 0-3 clock signals, as well as the VCOClk signal, having relative phases and frequencies based on the VCO-BIAS voltage provided from the loop filter/charge pump 330. The PLL circuit may set the VCOBIAS voltage such that the VCOClk signal and the PHASE 0-3 clock signals have frequencies that are equal to a frequency of the RefClk signal. The multi-stage VCO may be further configured to provide the PHASE 0-3 clock signals such that they are phase shifted relative to one another by 90 degrees. For example, the PHASE 0 clock signal may be phased-shifted 0 degrees relative to the RefClk signal, the PHASE 1 clock signal may be phased-shifted 90 degrees relative to the RefClk signal, the PHASE 2 clock signal may be phased-shifted 180 degrees relative to the RefClk signal, and the PHASE 3 clock signal may be phased-shifted 270 degrees relative to the RefClk signal. The PHASE 0-3 clock signals may be provided to I/O circuitry to receive and buffer write data received via data terminals in input buffers, and/or to deserialize received write data for storing in a memory cell array.

In operation, the PLL and VCO circuit 300 may be configured to generate frequency and phase shifted clock signals PHASE 0-3 based on the RefClk signal. The 304 may control the VCOBIAS voltage provided to the multi-stage VCO based on relative timing and frequencies of the RefClk signal and the VCOClk signal. The VCOBIAS voltage may control the timing and frequency of the PHASE 0-3 clock signals provided by the multi-stage VCO.

Specifically, the phase detector 310 may detect a phase difference between the RefClk signal and the VCOClk signal, and in response to detection of a deviation in the relative phases, may provide a pulse on one of the PDU or PDD signals based on a direction of the phase deviation. In response to the pulse on the one of the PDU and PDD signals, the loop filter/charge pump 330 may adjust the VCOBIAS voltage to change the frequency and phase of the PHASE0-3 clock signals and the VCOClk signal.

The frequency detector 320 may detect a frequency difference between the RefClk signal and the VCOClk signal from the multi-stage VCO and may provide a pulse on one of the FDU or the FDD signals, and in response to the pulse on one of the FDU or the FDD signals, the loop filter/charge pump 330 may adjust the VCOBIAS voltage to change the frequency and phase of the PHASE0-3 clock signals and the VCOBIAS signal provided by the multi-stage VCO. However, because the 304 attempts to adjust the timing and the frequency of the feedback clock signal to match the same of the RefClk signal, the logic circuity of the frequency detector 320 may encounter scenarios that result in metastable states (e.g., or metastable conditions). A metastable condition may occur when relative timing of transitions of the RefClk and VCOClk signals results in conditions where logic circuitry of the frequency detector 320 may erroneously detect a frequency deviation between the RefClk signal and the VCOClk signal. As a result of the erroneous detection of the frequency deviation, the frequency detector 320 may cause the bias voltage to be adjusted such that the frequency and timing of the PHASE 0-3 clock signals are changed. The change to the PHASE 0-3 clock signals based on the erroneous frequency deviation detection may affect operation of circuitry that uses the PHASE 0-3 clock signals. To reduce a likelihood that the frequency detector encounters a metastable state, the frequency detector 320 may include an input delay circuit that is configured to introduce an asynchronous timing delay to one of the RefClk signal or the VCOClk clock signal such that signal transitions are offset. As the frequency detector 320 is configured to detect frequency differences, timing or phase differences caused by the asynchronous timing delay may not affect an ability of the frequency detector 320 to detect frequency differences between the RefClk and VCOClk signals.

The multi-stage VCO may be configured to provide the PHASE0-3 clock signals having relative phases and frequencies based on the bias voltage provided from the PLL circuit. The PHASE 0-3 clock signals may have a frequency that is equal to a frequency of the RefClk signal, and may be phase shifted relative to one another by 90 degrees. For example, the PHASE 0 clock signal may be phased-shifted 0 degrees relative to the RefClk signal, the PHASE 1 clock signal may be phased-shifted 90 degrees relative to the RefClk signal, the PHASE 2 clock signal may be phased-shifted 180 degrees relative to the RefClk signal, and the PHASE 3 clock signal may be phased-shifted 270 degrees relative to the RefClk signal. The PHASE 0-3 clock signals may be provided to I/O circuitry to receive and buffer write data received via data terminals in input buffers, and/or to deserialize received write data for storing in a memory cell array.

Applying the asynchronous timing delay to one of the RefClk or VCOClk signals at the frequency detector 320 may reduce likelihood of encountering conditions for a metastable state, which may improve reliability of the PHASE 0-3 clock signals provided by the multi-stage VCO.

Figure 4:
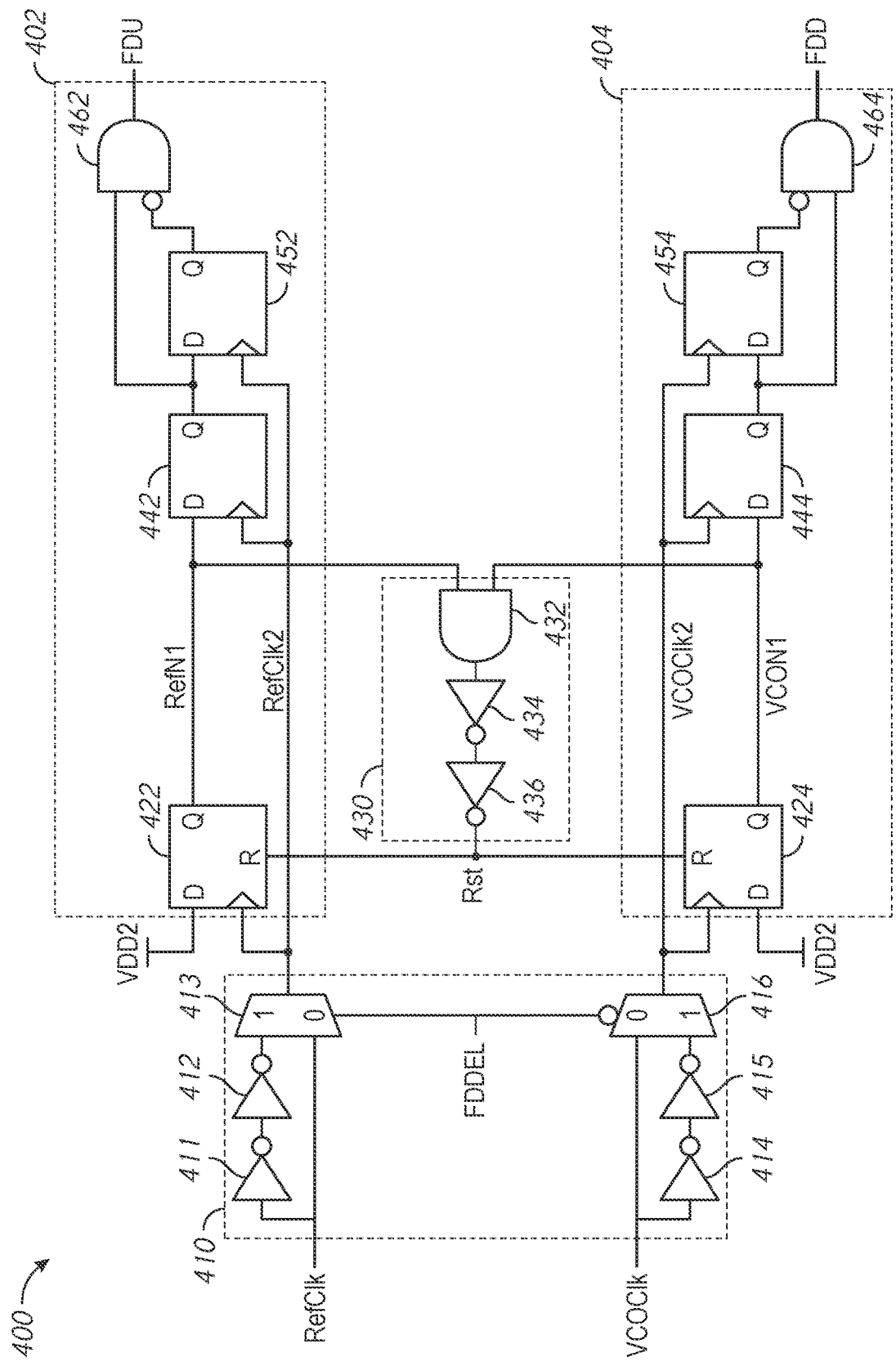
FIG. 4 is a logic diagram of a frequency detector in accordance with embodiments of the disclosure.

FIG. 4 is a logic diagram of a frequency detector 400 in accordance with an embodiment of the disclosure. The frequency detector 400 may include delay circuit 410, a first frequency detection circuit 402, a second frequency detection circuit 404, and a reset circuit 430. The divider and buffer circuit 107 of FIG. 1, the PLL and VCO circuit 220 of FIG. 2, and/or the frequency detector 320 of FIG. 3 may implement the frequency detector 400. The frequency detector 400 may be configured to provide a frequency-deviation up signal FDD and a frequency-deviation down signal FDD in response to detection of a frequency deviation between the RefClk and VCOClk signals. The FDU and FDD signals may a bias voltage (e.g., the VCOBIAS voltage of FIG. 3) to be adjusted, which may cause timing of the VCOClk signal (e.g., along with phase-shifted clock signals, such as PHASE 0-3 clock signals) to be adjusted by a multi-stage VCO circuit (e.g., the multi-stage VCO of FIG. 3).

The delay circuit 410 may include a multiplexer 413 configured to receive the RefClk signal and a delayed RefClk signal via inverters 411 and 412. The delay circuit 410 may be further include a multiplexer 416 configured to receive the VCOClk signal and a delayed VCOClk signal via inverters 414 and 415. The multiplexer 413 and the multiplexer 416 may be controlled via a control signal FDDEL. That is, the multiplexer 413 may select one of the RefClk signal or the delayed RefClk signal to provide to the first frequency detection circuit 402 as a RefClk2 signal in response to the FDDEL signal, and the multiplexer 416 may select one of the VCOClk signal or the delayed VCOClk signal to provide to the second frequency detection circuit 404 as a VCOClk2 signal in response to the FDDEL signal. In some examples, the multiplexer 413 and the multiplexer 416 may be configured such that, to provide the RefClk2 and VCOClk2 signals, one of the multiplexer 413 or the multiplexer 416 selects the respective non-delayed RefClk or VCOClk signal and the other of the multiplexer 413 and the multiplexer 416 selects the delayed RefClk or VCOClk signal. As such, the RefClk2 and the VCOClk2 signals may be delayed relative to one another. In some examples, the FDDEL signal may periodically switch which of the multiplexer 413 or the multiplexer 416 is configured to provide the delayed RefClk or VCOClk signal, such as once every 2, 4, 6, 8 or other number of cycles of the RefClk signal.

The first frequency detection circuit 402 may be configured to receive an output of the multiplexer 413 and to provide the FDU signal. The first frequency detection circuit 402 may include a flip-flop 422, a flip-flop 442, a flip-flop 452, and an AND gate 462. An input of the flip-flop 422 may be coupled to a VDD voltage (e.g., indicating a high logical value), and in response to the RefClk2 signal, may propagate the logical high value to an output as a RefN1 signal. The flip-flop 422 may reset the RefN1 signal in response to a reset signal RST provided from the reset circuit 430. The flip-flop 442 may be configured to propagate the RefN1 signal to an output in response to the RefClk signal. The output of the flip-flop 442 may be coupled to inputs of the flip-flop 452 and the AND gate 462. In response to the RefClk2 signal, the flip-flop 452 may propagate the output of the flip-flop 442 to an output. The output of the flip-flop 452 may be coupled to an inverted input of the AND gate 462. The AND gate 462 may provide the FDU signal using AND logic.

The second frequency detection circuit 404 may include a flip-flop 424, a flip-flop 444, a flip-flop 454, and an AND gate 464. An input of the flip-flop 424 may be coupled to a VDD voltage (e.g., indicating a high logical value), and in response to the VCOClk2 may propagate the logical high value to an output as a VCON1 signal. The flip-flop 422 may reset the VCON1 signal in response to the RST signal provided from the reset circuit 430. The flip-flop 444 may be configured to propagate the VCON1 signal to an output in response to the VCOClk signal. The output of the flip-flop 444 may be coupled to inputs of the flip-flop 454 and the AND gate 464. In response to the VCOClk2 signal, the flip-flop 454 may propagate the output of the flip-flop 444 to an output. The output of the flip-flop 454 may be coupled to an inverted input of the AND gate 464. The AND gate 464 may provide the FDD signal using AND logic.

The reset circuit 430 may include an AND gate 432 having an output coupled to inverters 434 and 436. The AND gate 432 may receive the RefN1 signal and the VCON1 signal, and may provide the RST signal via the inverters AND gate 432 and 436 using AND logic. Thus, when both of the RefN1 and VCON1 signals are set high, the RST signal may be set high to reset the flip-flop 422 and the flip-flop 424.

In operation, the frequency detector 400 receives the RefClk signal and the VCOClk signal. To avoid a metastable condition (e.g., when relative timing of transitions of the RefClk and VCOClk signals results in conditions the first frequency detection circuit 402 or the second frequency detection circuit 404 may erroneously detect a frequency deviation between the RefClk signal and the VCOClk signal), the delay circuit 410 may apply a delay to one of the RefClk or the VCOClk signals for use by the first frequency detection circuit 402 and the second frequency detection circuit 404, respectively. That is, in response to the FDDEL signal, one of the multiplexer 413 or the multiplexer 416 selects the respective non-delayed RefClk or VCOClk signal and the other of the multiplexer 413 and the multiplexer 416 selects the delayed RefClk or VCOClk signal. For example, when the FDEL signal is set to a first value, the multiplexer 413 selects the RefClk signal and the multiplexer 416 selects the delayed VCOClk signal (via inverters 414 and 415). When the FDEL signal is set to a second value, the multiplexer 413 selects the delayed RefClk signal (via inverters 411 and 412) and the multiplexer 416 selects the VCOClk signal. In some examples, the FDDEL signal may periodically switch which of the multiplexer 413 or the multiplexer 416 is configured to provide the delayed RefClk or VCOClk signal, such as once every 2, 4, 6, 8 or other number of cycles of the RefClk signal.

The first frequency detection circuit 402, the second frequency detection circuit 404, and the reset circuit 430 may determine whether a frequency of the RefClk signal is different than a frequency of the VCOClk signal. In response to the RefClk signal having a higher frequency than the VCOClk signal, the first frequency detection circuit 402 may provide a pulse on the FDU signal. In response to the RefClk signal having a lower frequency than the VCOClk signal, the second frequency detection circuit 404 may provide a pulse on the FDD signal.

Specifically, the first frequency detection circuit 402 may determine that the RefClk signal has a higher frequency than the VCOClk signal if the high logical value (e.g., VDD voltage) received at an input of the flip-flop 422 is able to be propagated through to an output of the flip-flop 442 prior to the RST signal resetting the flip-flop 422. Similarly, the second frequency detection circuit 404 may determine that the RefClk signal has a lower frequency than the VCOClk signal if the high logical value (e.g., VDD voltage) received at an input of the flip-flop 424 is able to be propagated through to an output of the flip-flop 444 prior to the RST signal resetting the flip-flop 424. The reset circuit 430 may set the RST signal in response to both the RefClk and VCOClk signals contemporaneously having high logical values.

In response to detecting that the RefClk signal has a higher frequency than the VCOClk signal, the first frequency detection circuit 402 may provide a pulse on the MU signal. A duration of the pulse on the FDD signal may be equal to one cycle of the RefClk2 signal based on the flip-flop 452 and logic of the AND gate 462. In response to detecting that the RefClk signal has a lower frequency than the VCOClk signal, the second frequency detection circuit 404 may provide a pulse on the FDD signal. A duration of the pulse on the FDD signal may be equal to one cycle of the VCOClk2 signal based on the flip-flop 454 and logic of the AND gate 464.

Applying the asynchronous timing delay to one of the RefClk or VCOClk signals via the delay circuit 410 may reduce likelihood of encountering conditions for a metastable state of the first frequency detection circuit 402 and the second frequency detection circuit 404.

Figure 5:
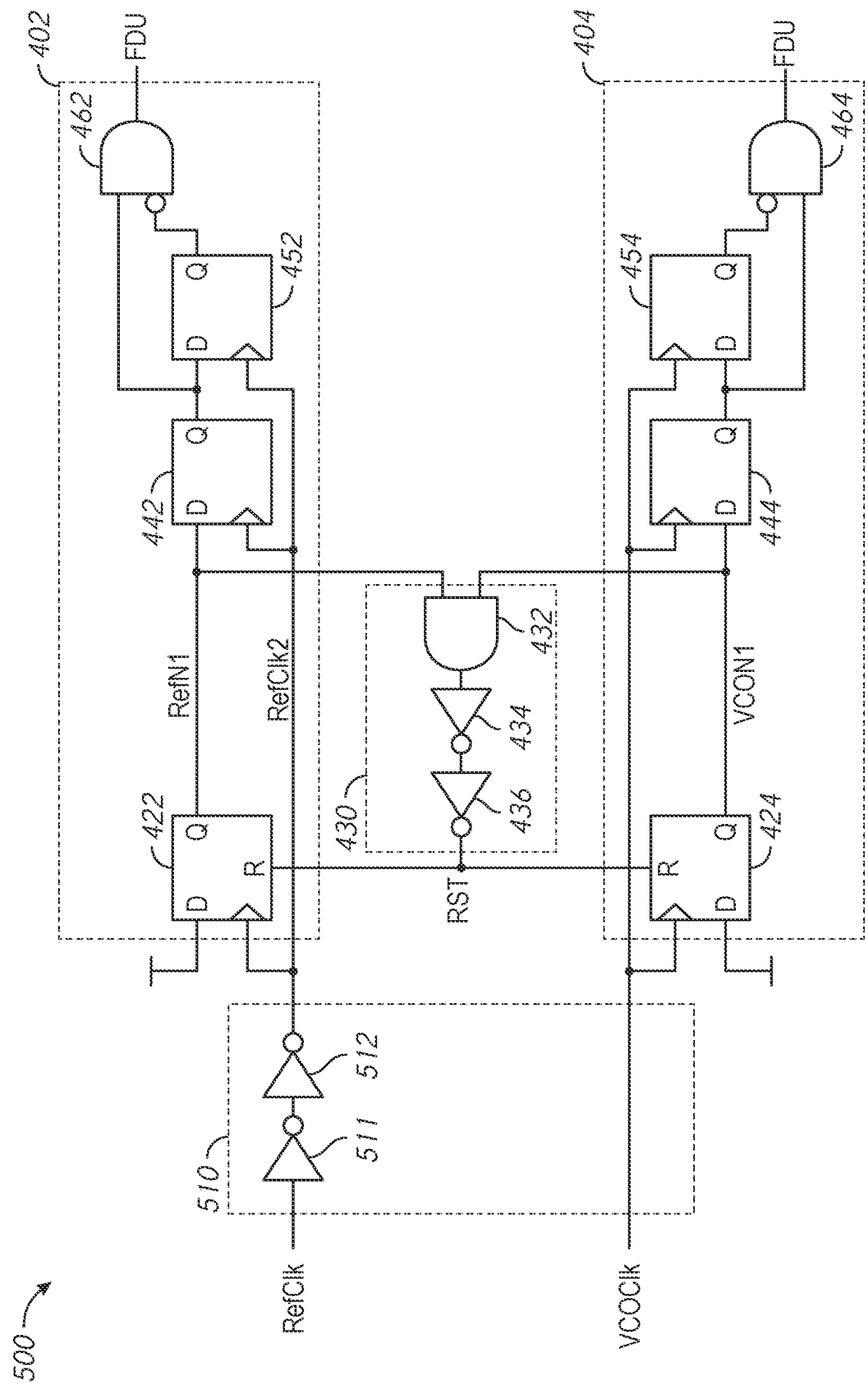
FIG. 5 is a logic diagram of a frequency detector in accordance with an embodiment of the disclosure.

FIG. 5 is a logic diagram of a frequency detector 500 in accordance with an embodiment of the disclosure. The frequency detector 500 may include delay circuit 510, a 502, a 504, and a 530. The divider and buffer circuit 107 of FIG. 1, the PLL and VCO circuit 220 of FIG. 2, and/or the frequency detector 320 of FIG. 3 may implement the frequency detector 500. The frequency detector 500 may be configured to provide a frequency-deviation up signal FDU and a frequency-deviation down signal FDD in response to detection of a frequency deviation between the RefClk and VCOClk signals. The FDU and FDD signals may a bias voltage (e.g., the VCOBIAS voltage of FIG. 3) to be adjusted, which may cause timing of the VCOClk signal (e.g., along with phase-shifted clock signals, such as PHASE 0-3 clock signals) to be adjusted by a multi-stage VCO circuit (e.g., the multi-stage VCO of FIG. 3). The frequency detector 500 may include elements that have been previously described with respect to the frequency detector 400 of FIG. 4. Those elements have been identified in FIG. 5 using the same reference numbers used in FIG. 4 and operation of the common elements is as previously described.

The delay circuit 510 may include inverters 511 and 512 that are configured to delay the RefClk signal provided to the first frequency detection circuit 402. Thus, rather than selectively using a delayed RefClk or VCOClk signal via the delay circuit 410 of FIG. 4, the delay circuit 510 always uses a delayed RefClk signal. In some examples, the inverters 5111 and 512 may alternatively be coupled to the VCOClk signal instead of the RefClk signal without departing from the scope of the disclosure. In the frequency detector 500, the VCOClk signal and the VCOClk2 signal are the same signal. As such, the VCOClk2 signal is not labeled in FIG. 5.

In operation, the frequency detector 500 receives the RefClk signal and the VCOClk signal. To avoid a metastable condition (e.g., when relative timing of transitions of the RefClk and VCOClk signals results in conditions the first frequency detection circuit 402 or the second frequency detection circuit 404 may erroneously detect a frequency deviation between the RefClk signal and the VCOClk signal), the delay circuit 510 may apply a delay to the RefClk for use by the first frequency detection circuit 402. The first frequency detection circuit 402, the second frequency detection circuit 404, and the reset circuit 430 may determine whether a frequency of the RefClk signal is different than a frequency of the VCOClk signal. In response to the RefClk signal having a higher frequency than the VCOClk signal, the first frequency detection circuit 402 may provide a pulse on the FDU signal. In response to the RefClk signal having a lower frequency than the VCOClk signal, the second frequency detection circuit 404 may provide a pulse on the FDU signal.

Applying the asynchronous timing delay to the RefClk signal (e.g., alternatively to the VCOClk signal) via the delay circuit 510 may reduce likelihood of encountering conditions for a metastable state of the first frequency detection circuit 402 and the second frequency detection circuit 404.

Figure 6:
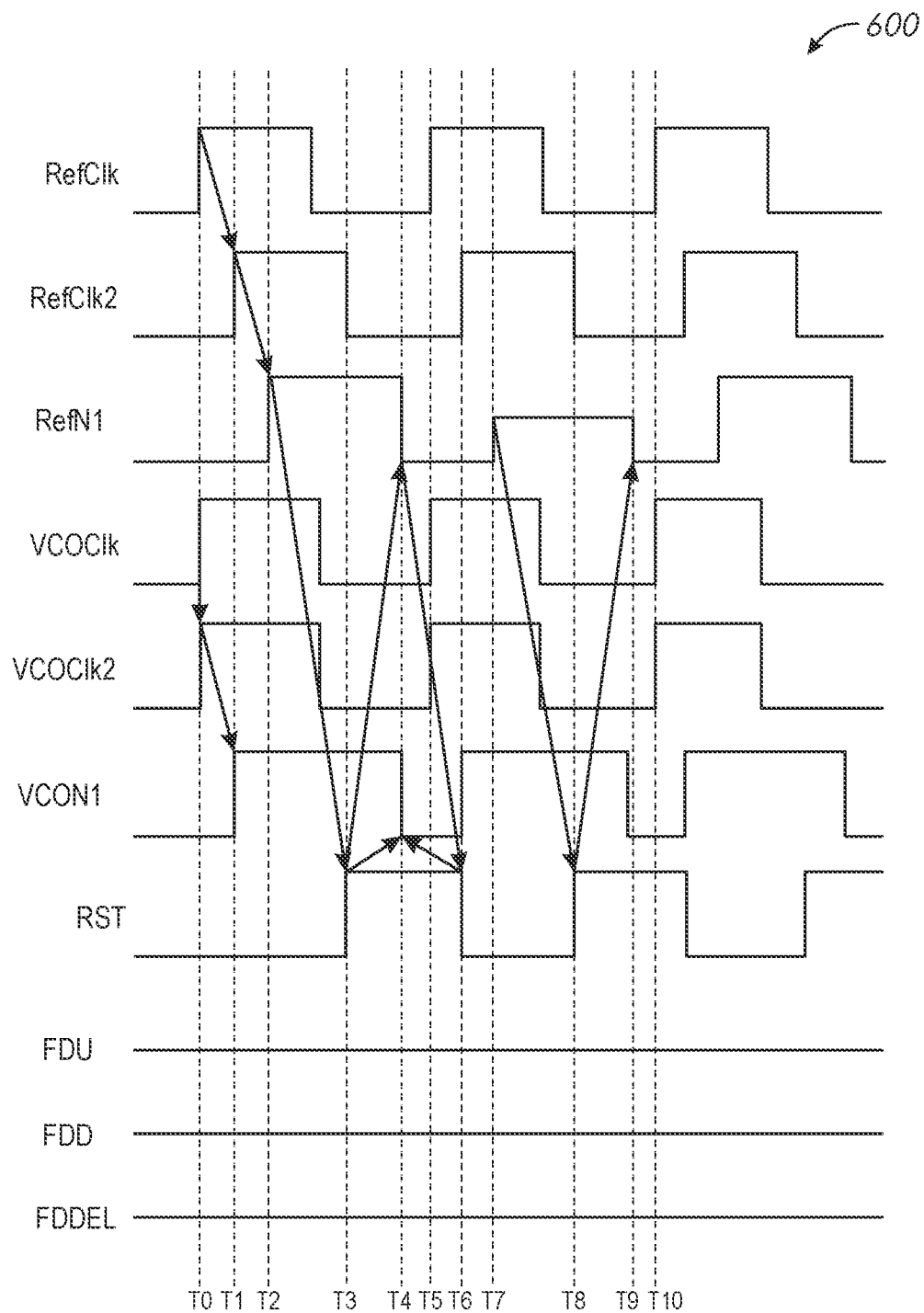
FIG. 6 is an illustration of an exemplary timing diagram depicting a reset operation of a divider circuit in accordance with embodiments of the disclosure.

FIG. 6 is an illustration of an exemplary timing diagram 600 depicting operation of a frequency detector in accordance with embodiments of the disclosure. In some examples, the timing diagram 600 may depict operation of the divider and buffer circuit 107 of FIG. 1, the PLL and VCO circuit 220 of FIG. 2, the frequency detector 320 of FIG. 3, the frequency detector 400 of FIG. 4, the frequency detector 500 of FIG. 5, or combinations thereof. The RefClk signal may correspond to the RefClk signal discussed with respect to FIGS. 2-5. The VCOClk, FDU, and FDD signals may correspond to the VCOClk, FDU, and FDD signals discussed with respect to FIGS. 3-5. The RefClk2, REFN1, VCOClk2, VCON1, RST, and FDDEL signals may correspond to the RefClk2, REFN1, VCOClk2, VCON1, RST, and FDDEL signals discussed with respect to FIGS. 4 and 5. In the example timing diagram 600, the RefClk and VCOClk signals are phase aligned at time T0. In addition, the example depicted in the timing diagram includes application of an asynchronous delay to the RefClk signal (e.g., via the delay circuit 410 of FIG. 4 or the delay circuit 510 of FIG. 5).

At time T0, the RefClk and the VCOClk signal may transition to a high logical value. In response, the VCOClk2 signal may also transition to the high logical value (e.g., via the delay circuit 410 of FIG. 4 or the delay circuit 510 of FIG. 5) at time T0. At time T1, in response to transition of the VCOClk2 signal (or the VCOClk signal), the VCON1 signal may transition to the high logical value (e.g., via the flip-flop 424 of FIGS. 4 and 5).

Also at time T1, after a delay (e.g., via the inverters 411 and 412 of FIG. 4 or the inverters 511 and 512 of FIG. 5) from time T0 to time T1, the RefClk2 clock may transition to the high logical value in response to the RefClk signal. In some examples, the delay between times T0 and T1 may be asynchronous relative to timing of the RefClk or VCOClk signals. At time T2, in response to transition of the RefClk2 signal, the RefN1 signal may transition to the high logical value (e.g., via the flip-flop 422 of FIGS. 4 and 5).

At time T3, in response to both the RefN1 and VCON1 signals being set to high logical values, the RST signal may transition to a high logical value (e.g., via the reset circuit 430 of FIGS. 4 and 5). At time T4, both the RefN1 and the VCON1 signals may transition to low logical values in response to the RST signal (e.g., via the flip-flop 422 and flip-flop 424, respectively, of FIGS. 4 and 5). At time T5, the RefClk, VCOClk, and VCOClk2 signals may transition to high logical values. At time T6, in response to transition of the RefN1 and the VCON1 signals, the RST signal may transition to a low logical value (e.g., via the reset circuit 430 of FIGS. 4 and 5). Also at time T6, in response to transition of the RST signal to the low logical value and to the VCOClk and VCOClk2 signals having the high logical values, the VCON1 signal may transition to the high logical value.

In addition, in response to the transition of the RefClk signal to the high logical value, the RefClk2 signal may transition to the high logical value at time T6. At time T7, in response to transition of the RefClk2 signal, the RefN1 signal may transition to a metastable state (e.g., somewhere between a high logical value and a low logical value. However, at time T8, in response to the VCON1 signal having high logical values, the RST signal may transition to a high logical value despite the RefN1 signal being in the metastable state. At time T9, in response to transition of the RST signal to a high logical value, the RefN1 and VCON1 signals may transition to low logical values. Thus, the RefN1 signal may transition away from the metastable state in response to the RST signal. At time T10, the process may start over in response to transition of the RefClk and VCOClk signals.

The timing diagram 600 is exemplary for illustrating operation of various described embodiments. Although the timing diagram 600 depicts a particular arrangement of signal transitions of the included signals, one of skill in the art will appreciate that additional or different transitions may be included in different scenarios without departing from the scope of the disclosure, including addition of delays between serially-related signals. Further, the depiction of a magnitude of the signals represented in the timing diagram 600 is not intended to be to scale, and the representative timing is an illustrative example of a timing characteristics.

Although this disclosure has been described in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosure. Thus, it is intended that the scope of at least some of the present disclosure herein disclosed should not be limited by the particular disclosed embodiments described above.

What is claimed is:

1. A frequency detector comprising:
a delay circuit configured to receive a first signal and a second signal and to apply a delay to the first signal to provide a delayed first signal;
a first frequency detection circuit configured to receive the delayed first signal and provide a pulse on a first output signal in response to detection that the delayed first signal has a frequency that is greater than a frequency of the second signal; and
a second frequency detection circuit configured to receive the second signal and to provide a pulse on a second output signal in response to detection that the second signal has a frequency that is greater than a frequency of the delayed first signal.

2. The frequency detector of claim 1, wherein the delay circuit comprises a pair of serially-coupled inverters configured to receive the first signal and to provide the delayed first signal.

3. The frequency detector of claim 1, wherein the delay circuit is configured to apply the delay to the first signal during a first time period and to apply the delay to the second signal during a second time period to provide a delayed second signal, wherein, during the second time period, the first signal is provided to the first frequency detection circuit and the delayed second signal is provided to the second frequency detection circuit.

4. The frequency detector of claim 1, wherein the delay circuit comprises a multiplexer configured to selectively provide the first signal or the delayed first signal based on a value of a control signal.

5. The frequency detector of claim 1, wherein the first frequency detection circuit comprises:
a first flip-flop configured to propagate a first logical signal to an output in response to the delayed first signal; and
a second flip-flop configured to propagate an output of the first flip-flop to an output in response to the delayed first signal.

6. The frequency detector of claim 5, further comprising a reset circuit configured to reset the first and second frequency detection circuits based on relative timing of the delayed first signal and the second signal.

7. The frequency detector of claim 6, wherein the reset circuit includes an AND gate coupled in series with a pair of inverters, wherein the AND gate is configured to compare the first logical signal with a signal from the second frequency detection circuit to determine whether to reset the first and second frequency detection circuits.

8. The frequency detector of claim 5, wherein the second frequency detection circuit comprises:
a third flip-flop configured to propagate a second logical signal to an output in response to the second signal; and
a fourth flip-flop configured to propagate an output of the third flip-flop to an output in response to the second signal.

9. The frequency detector of claim 5, wherein the first frequency detection circuit further comprises a third flip-flop configured to propagate a third logical signal to an output in response to the delayed first signal.

10. The frequency detector of claim 1, wherein the delay circuit is configured to apply an asynchronous delay to the first signal.

11. A method comprising:
receiving a first signal and a second signal at a frequency detector;
during a first time period:
delaying the first signal to provide a delayed first signal; and
comparing a frequency of the delayed first signal and the second signal to detect a frequency deviation between the first signal and the second signal; and
in response to detection of a frequency deviation, causing a frequency of one of the first or second signals to change; and
during a second time period after the first time period:
delaying the second signal to provide a delayed second signal; and
comparing a frequency of the delayed second signal and a frequency of the first signal to detect a frequency deviation between the first signal and the second signal, wherein a duration of the first time period and the second time period is based on a count of cycles of the first signal or the second signal.

12. A method comprising:
receiving a first signal and a second signal at a frequency detector;
during a first time period:
delaying the first signal to provide a delayed first signal; and
comparing a frequency of the delayed first signal and the second signal to detect a frequency deviation between the first signal and the second signal; and
in response to detection of a frequency deviation, causing a frequency of one of the first or second signals to change;
during a second time period after the first time period:
delaying the second signal to provide a delayed second signal; and
comparing a frequency of the delayed second signal and a frequency of the first signal to detect a frequency deviation between the first signal and the second signal; and
during a third time period after the second time period:
delaying the first signal to provide the delayed second signal; and
comparing the frequency of the delayed first signal and the frequency of the second signal to detect a frequency deviation between the first signal and the second signal.

13. The method of claim 11, further comprising delaying the first signal via a pair of inverters.

14. The method of claim 11, further comprising adjusting a frequency of a clock signal based on the frequency deviation.

15. The method of claim 11, further comprising receiving the second signal from a voltage-controlled oscillator.

16. The method of claim 11, further comprising resetting the comparison between the frequency of the delayed first signal and the frequency of the second signal based on relative timing differences between the delayed first signal and the second signal.

17. The method of claim 11, further comprising delaying the first signal via an asynchronous delay.

18. The method of claim 11, further comprising determining a phase difference between the first signal and the second signal.

\* \* \* \* \*